United States Patent [19]
Dao et al.

[11] Patent Number: 5,700,602
[45] Date of Patent: Dec. 23, 1997

[54] METHOD AND APPARATUS FOR PRECISION DETERMINATION OF PHASE-SHIFT IN A PHASE-SHIFTED RETICLE

[75] Inventors: Giang T. Dao, Fremont; Nelson N. Tam, Foster City; Gang Liu, Sunnyvale; Jeffrey N. Farnsworth, Los Gatos, all of Calif.

[73] Assignee: Intel Corporation, Santa Clara, Calif.

[21] Appl. No.: 538,354

[22] Filed: Oct. 30, 1995

Related U.S. Application Data

[63] Continuation of Ser. No. 239,412, May 6, 1994, abandoned, which is a continuation-in-part of Ser. No. 12,564, Feb. 2, 1993, Pat. No. 5,348,826, which is a continuation-in-part of Ser. No. 933,400, Aug. 21, 1992, Pat. No. 5,302,477, which is a continuation-in-part of Ser. No. 933,341, Aug. 21, 1992, Pat. No. 5,300,379.

[51] Int. Cl.$^6$ .................................................. G03F 9/00
[52] U.S. Cl. ..................... 430/5; 430/22; 430/394
[58] Field of Search ......................... 430/5, 22, 322, 430/324, 394

[56] References Cited

U.S. PATENT DOCUMENTS

| | | | |
|---|---|---|---|
| 4,231,811 | 11/1980 | Somekh et al. | 148/1.5 |
| 4,360,586 | 11/1982 | Flanders et al. | 430/5 |
| 4,881,257 | 11/1989 | Nakagawa | 430/5 |
| 4,890,309 | 12/1989 | Smith et al. | 378/35 |
| 5,045,417 | 9/1991 | Okamoto | 430/5 |
| 5,049,925 | 9/1991 | Aiton et al. | 355/53 |
| 5,135,609 | 8/1992 | Pease et al. | 156/654 |
| 5,229,255 | 7/1993 | White | 430/311 |

FOREIGN PATENT DOCUMENTS

| | | |
|---|---|---|
| 0090924 | 8/1983 | European Pat. Off. . |
| 0395425 | 10/1990 | European Pat. Off. . |
| 0492630 | 7/1992 | European Pat. Off. . |
| 9120018 | 12/1991 | WIPO . |

OTHER PUBLICATIONS

"Application of an Aerial Image Measurement System of Mask Fabrication and Analysis", Richard A. Ferguson, Ronald M. Marino, Russell A. Budd, John L. Staples, Lars W. Liebmann, Derek B. Dove, and J. Tracy Weed, SPIE vol. 2087 Photomask Technology and Management 3 (1993), pp. 131–144.

N. Hasegawa, A. Imai, T. Terasawa, T. Tanaka, F. Murai. *The Japan Society of Applied Physics and Related Societies* "Extended Abstracts 29p–ZC–3, Submicron Lithography Using Phase Mask (9): Halftone Phase Shifting Mask" 1991.

K. Nakagawa, N. Ishiwata, Y. Yanagishita, Y. Tabata. *The Japan Society of Applied Physics and Related Societies* "Extended Abstracts 29p–ZC–2, Phase Shifting Photolithography Applicable to Real IC Patterns" Mar. 1991.

(List continued on next page.)

*Primary Examiner*—S. Rosasco
*Attorney, Agent, or Firm*—Blakely, Sokoloff, Taylor & Zafman

[57] ABSTRACT

A metrology pattern on a reticle comprising a phase-shifted feature and an additional phase-shifted feature and/or non phase-shifted feature is disclosed. The metrology pattern can be used to determine the target thickness for achieving 180° phase difference, i.e., zero phase error on a phase-shifted reticle. A test reticle having several such metrology patterns, with several different phase-shifter thickness differences is used to produce a CD versus defocus data for each of the phase-shifter thickness differences by performing an exposure matrix or series of aerial images. The data can be used to determine a target thickness for zero phase error. The data can also be used to determine a correlation between focal shift, phase error, and shifter thickness. The metrology pattern can be placed on reticles used for the fabrication of semiconductor devices, for example, so that an exposure matrix can be performed, to determine any focal shift, which can then be related to phase error.

51 Claims, 9 Drawing Sheets

OTHER PUBLICATIONS

Lin, Burn J. "The Attenuated Phase-Shifting Mask" *Solid State Technology* Jan. 1992.

Andrew R. Neureuther, "Modeling Phase Shifting Masks", Preliminary Version of BACUS Symposium Paper, Dept. of Electrical Engineering and Computer Sciences, University of California Berkeley, CA 94720, Sep. 26, 1990 pp. 1–6 and FIGS. 1–13.

H. Ohtsuka, K. Abe, T. Onodera, K. Kuwahara, "Conjugate Twin-Shifter For The New Phase Shift Method to High Resolution Lithography", V–LSI R&D Center, OKI Electric Industry Co., Ltd, SPIE vol. 1463 Optical/Laser Microlithography IV (Mar. 1991) pp. 112–123.

METHOD AND APPARATUS FOR PRECISION DETERMINATION OF PHASE-SHIFT IN A PHASE-SHIFTED RETICLE

This is a continuation of application Ser. No. 08/239,412, filed May 6, 1994, now abandoned, which is a continuation-in-part of U.S. application Ser. No. 08/012,564, filed Feb. 2, 1993, now U.S. Pat. No. 5,348,826 which is a continuation in part of U.S. application Ser. No. 07/933,400, filed Aug. 21, 1992, now U.S. Pat. No. 5,302,477, and which is a continuation-in-part of U.S. application Ser. No. 07/933,341, filed Aug. 21, 1992, now U.S. Pat. No. 5,300,379, which applications are assigned to the assignee of the present invention.

BACKGROUND OF THE INVENTION

1. Field of the Invention

The present invention relates to a lithography method and apparatus for use in, for example, the fabrication of semiconductor devices, and more particularly to a method and apparatus for determining phase shift in a phase-shifted reticle.

2. Background Information

In the semiconductor industry, there is-a continuing effort to increase device density by scaling device size. State of the art devices currently have device features with a dimension well below 1 micron (submicron). To form these features, a photosensitive layer is formed on a substrate or device layer, and is exposed to radiation through a reticle. The reticle typically comprises a substantially transparent base material with an opaque layer having the desired pattern formed thereon, as is well known. At the submicron level, diffraction effects become significant, resulting in image blurring near the edges of features.

To minimize effects of diffraction, phase-shifted reticles have been used in the prior art. Typically, a phase-shifted reticle has a radiation transmitting opening corresponding to the pattern to be formed, and a proximate phase-shifter which also transmits the exposing radiation but shifts the phase of the radiation approximately 180° relative to the openings. The radiation transmitted through the phase-shifter destructively interferes with, and therefore cancels to some extent, diffracted radiation from the opening near the edges, thereby producing sharper feature edges.

Since phase-shifting reticles minimize the effects of diffraction by utilizing destructive interference, the phase-shifted reticle is most effective when the phase difference between the opening and the phase-shifter is precisely 180°. Although phase-shifted reticles are effective within a certain range of 180°, it is desirable to manufacture the reticles as close to 180° as possible, to achieve the maximum benefits of phase-shifting.

It is difficult to produce reticles with a phase-shift of precisely 180°. As is well known, the 180° phase-shift is typically achieved by adding material to, or removing material from, one of the regions relative to the other such that radiation transmitted through the two regions is 180° out of phase. For example, if the reticle base is made of quartz, a thickness of quartz may be removed from one of the regions relative to the other. The amount of material to be added to or removed from one region relative to the other to achieve 180° phase-shift can be determined by the formula:

$$t = x\lambda/2(n-1) \quad 1)$$

where t is the thickness of the material to be added or removed, λ is the exposing wavelength, x is an odd integer of 1 or greater, and n is the index of refraction of the phase-shifting material. One problem in manufacturing the phase-shifted reticle is that it is difficult to know n precisely. As can be seen from equation 1, an error in the value of n, will lead to miscalculation of the target thickness for 180° phase-shift. This problem is even more pronounced in attenuated phase-shifting reticles that use an embedded or multilayer film in place of an opaque chrome layer. The embedded film is engineered to have a reduced transmission compared to open regions (for example, 10% transmission) and to phase-shift radiation 180°, by forming one or more layers comprising several materials such as chrome, chromium oxide, and other materials, and/or incorporating O, N and other species into one or more layers in varying ratios, such that the transmitivity and phase-shift goals are met simultaneously. Due to the complex nature of these films, determination of n is even more problematic, so that determining the appropriate thickness for 180° phase-shift precisely is extremely difficult. Of course, it will be appreciated that even if it were possible to determine n with sufficient accuracy, a fundamental problem in the fabrication of phase-shifted reticles is the lack of an absolute thickness reference to achieve 180° phase-shift for each material and structure. That is, while the thickness can typically be measured with high repeatability, there is no way to relate the measured thickness value to the phase-shift achieved by the measured thickness. Therefore, although a reticle fabrication process can be engineered to repeatably produce a shifter having a given measured thickness, there is no way to ensure a precise phase-shift of 180°.

A further problem in phase-shifted reticles is focal shift, wherein the image dimension as a function of focal distance shifts in one direction or the other due to the presence of phase error. In a reticle having both phase-shifted and non phase-shifted features, this shift may make it difficult to image both types of features within tight dimensional tolerances. This problem is more pronounced in phase-shifted reticles having phase-shifted features which are not structurally identical to one another. As described in the above referenced copending U.S. patent application Ser. No. 08/012,564, and as will be discussed more fully herein, these reticles experience focal shift in opposite directions, i.e., a focal shift in one direction for some features and in the opposite direction for other features. While it may be possible to avoid designing masks with structurally non identical features, it is preferable to avoid the problem of focal shift all together.

What is needed is a method and apparatus for precision determination of phase-shift. It is desirable that the method and apparatus provide an absolute reference for phase-shift, without a need to know the precise value for the index of refraction, n and k. It is further desirable that the method and apparatus may be used as a tool to determine the proper target shifter thickness in the fabrication of phase-shifted reticles. It is also desirable that the method and apparatus allow for determination of the index refraction. Further, it is desirable that the method and apparatus may be used as a quality assurance tool for incoming quality control of phase-shifted reticles.

SUMMARY OF THE INVENTION

A method and apparatus for determining phase difference in a phase-shifted reticle is disclosed. A metrology pattern comprising a phase-shifted feature, and a structurally non identical phase-shifted feature or a non phase-shifted feature, or both is provided. In one embodiment, a reticle is fabricated comprising a plurality of such metrology patterns, each having a different thickness difference between an opening and its associated phase-shifter. An exposure matrix, or a series of aerial images is performed to determine focal shift of the first phase-shifted feature relative to the other phase-shifted feature and/or the non phase-shifted feature for each of the thicknesses. Zero phase error is determined from when the dimension versus defocus curves for two or all three of the features in the metrology pattern overlap, thus providing an absolute reference between measured thickness and phase. The thickness at which this overlap occurs is used as a target thickness for reticle fabrication. Additionally, the thickness at which the overlap occurs can also be used for a precise determination of the reticle or phase-shifter material's index of refraction. The data obtained from the exposure matrix or aerial images can also be used to correlate the measured shifter thickness with focal shift and with phase error. In another embodiment of the present invention, the metrology pattern is placed on a reticle to be used in device fabrication, so that the correlation between phase error and focal shift may be used to determine the phase error on the reticle.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures and in which.

DETAILED DESCRIPTION

Figure 1:
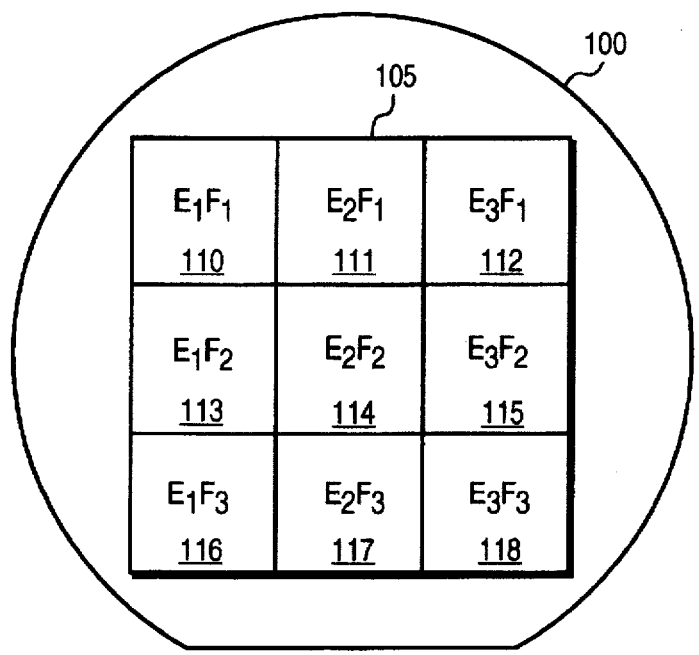
FIG. 1 illustrates the exposure doses and focal distances used in an exposure matrix

A method and apparatus for precision determination of phase-shift in a phase-shifted reticle is disclosed. In the following description, numerous specific details are set forth such as specific materials, reticle patterns, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

In a preferred embodiment of the present invention, light from a phase-shifting element is shifted relative to other proximate regions by varying the thickness of the quartz reticle base. Alternatively, phase-shifting can be accomplished by adding a thickness of a material as described earlier, or by a combination of removal and addition of material. From the description of the embodiments using removal of quartz, one skilled in the art will be enabled to practice the present invention using other methods of phase-shifting. For convenience, regions are nominally referred to as the 0° phase, or as the 180° phase, and regions may nominally be referred to as phase-shifted +180° relative to each other. It will be appreciated that this nomenclature is not necessarily meant to indicate the actual phase of radiation transmitted through a region or the actual phase difference between two regions. It will also be appreciated that any nominal or actual phase of a region or phase difference between regions encompasses all 360° multiples of the phase or phase difference. It will further be appreciated that for the phase-shifted reticle to be effective, the phase difference between a phase-shifting element and a proximate or adjacent opening does not need to be exactly 180° but may be anywhere between approximately 160°–200° (or 160°–200° plus a multiple of 360°). Of course, as mentioned earlier, a phase difference as close as possible to 180° is desirable.

In the following description shorthand terminology will be employed in order to simplify the discussion. To denote a region where sufficient quartz has been removed to phase-shift radiation a nominal 180°, terminology such as "180° of quartz has been removed" will be employed. Similarly, regions on the reticle which have had 180° of quartz removed compared with another region will be referred to as "180° below" the other region, while the other region will be referred to as "180° above" the region with 180° of quartz removed.

The present invention will be illustrated with the use of features which form openings in the photoresist similar to, for example contact openings. It will be understood in the present invention that other features, such as lines and spaces, or other features may be used in the practice of the present invention. Additionally, it will be appreciated that the present invention can be practiced on any type of phase-shifted reticle in addition to the reticles described herein. For example, the present invention may be practiced on an attenuating phase-shifted reticle, as will be described later. The features described herein have a central radiation transmitting region referred to as the "opening", which is surrounded by a phase-shifted radiation transmitting region referred to as the "rim". As mentioned earlier, some phase-shifted features are non structurally identical, in that the phase-shift between an opening and shifter is in opposite directions for the two types of features. These structures will be referred to as a nominal +180° structure or a nominal −180° structure. The denomination of one structure as a +180° structure and the other as a −180° is arbitrary and could be reversed, so long as the nomenclature is consistent. Herein, features having a rim above the opening will be considered phase-shifted in a positive direction (i.e., +180° features), and features having a rim below the opening will be considered phase-shifted in a negative direction (−180° features).

In photolithographic steps using a projection printer, exposure matrices are frequently carried out to characterize the photolithographic process. The matrix may be carried out periodically to check for any type of process drift, and/or may be carried out when a new reticle is installed, when new resist is used, etc. FIG. 1 illustrates the method by which the exposure matrix is performed. As shown, substrate 100 having a photoresist layer thereon, has exposure matrix 105 comprising nine stepping fields 110–118. As shown, stepping fields 110, 111, and 112 are exposed at a first focal distance, and three different exposure doses. Similarly, exposure fields 110, 113, and 116 are exposed at the first exposure level for three different focal distances. Thus, in the example shown in FIG. 1, three different exposure levels and three different focal distances for each of the three different exposure levels are exposed. It will be appreciated that FIG. 1 is exemplary of an exposure matrix, and larger matrices including more exposure levels and/or focal distances may be performed. After exposure of each of the stepping fields of matrix 105, the wafer is developed and the minimum dimension of the patterned features, known as the critical dimension (CD)is measured.

Figure 2:
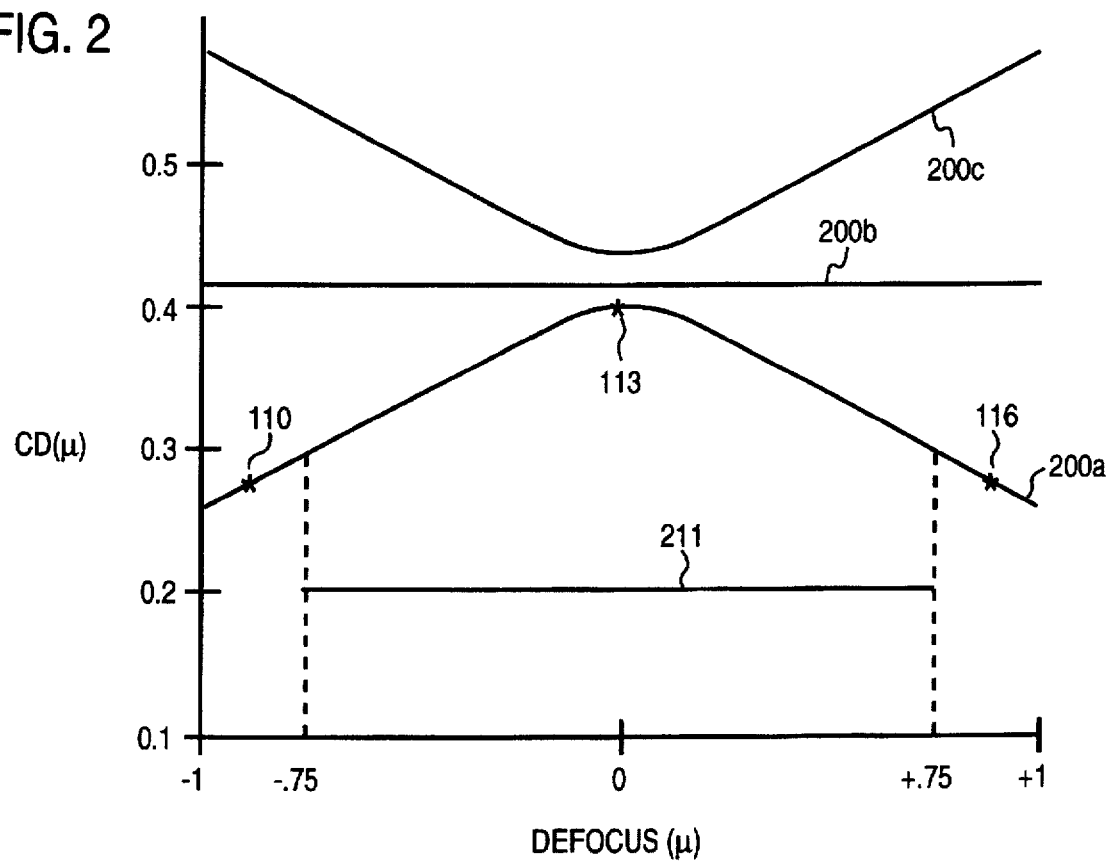
FIG. 2 illustrates exemplary data obtained from an exposure matrix such as that shown in FIG. 1.

FIG. 2 shows the results of the exposure matrix with CD in microns (μ) plotted as a function of focal distance (defocus) in microns, for a structure such as a contact opening. For example, curve 200a was obtained from the exposures done at the first, lowest level E1, i.e., the exposures in fields 110, 113, and 116. Curve 200b was obtained from the exposures done at the intermediate exposure level E2 in fields 111, 114, and 117, and curve 200c was obtained from the exposures done at the third, highest exposure level E3 in the fields 112, 115, and 118. The data obtained from the exposure in fields 110, 113, and 116 are shown plotted on curve 200a. In general, in the fabrication of semiconductor devices, it is desired to find an iso-focal line similar to line 200b, so that the dimension of the feature does not change significantly as the position of the photoresist layer with respect to the focal plane changes. However, for the present invention, a higher or lower exposure is desired so that a maxima or minima in the curve may be easily determined. While in the example shown in FIGS. 1 and 2, the intermediate focal point is at approximately zero defocus and the intermediate exposure is approximately iso-focal, it typically will take some experimentation to determine the zero defocus distance and the iso-focal exposure level.

Referring to curve 200a, the depth of focus (DOF) is illustrated. The depth of focus will depend upon the process specification. For example, assume that a process is carried out at exposure E1, resulting in curve 200a, and that the process specification allows for a CD above 0.3 μ. A defocus from −0.75–+0.75 μ produces a patterned image within the specification, resulting in depth of focus 211 (1.5 μ DOF). Of course it will be understood that the values described herein are merely illustrative, and the actual values may vary considerably based upon the feature being formed, exposure parameters, printer parameters, and other factors. One problem with the exposure matrix 105 is that the data may be distorted to some extent by various factors. For example, the wafer may be at a tilt with respect to the focal plane or may be non planar. Other errors may be introduced by the exposure system. Each portion of a single stepping field is focused onto wafer 100 by a different part of the lens, so that aberrations may be present. These effects may cause the data which are obtained to be distorted to some extent. Additionally, even if the monitor wafer 100 upon which the exposure matrix is carried out is planar and parallel to the focal plane, a wafer processed in production may be at an angle with respect to the focal plane and typically will have some areas with steep topography. Therefore, although a process may be designed to be carried out at zero defocus, there will typically be some displacement from the focal plane in some areas of the wafer.

Figure 3:
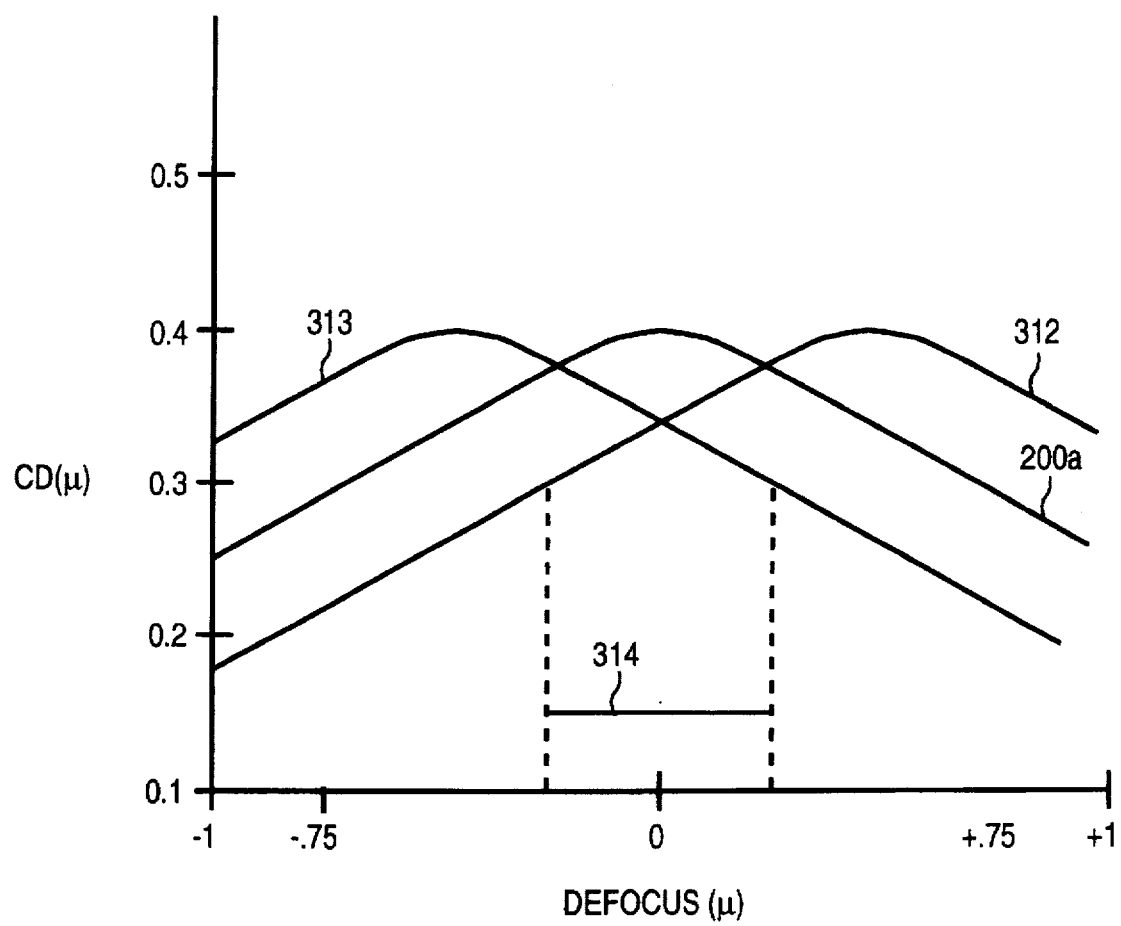
FIG. 3 illustrates focal shift due to phase error in the phase-shifted features.

As mentioned earlier, in a phase-shifted reticle, focal shift occurs, whereby curve 200 shifts as the phase difference between the phase-shifter and the feature varies from 180° (phase error). The direction of focal shift depends upon whether the phase-difference between the shifter and the feature is greater or less than 180° (i.e., whether there is positive or negative phase error). Using the previously defined direction of positive phase-shift (i.e., the phase-shifter having additional material compared with the opening) the curve 200 shifts to the right with negative phase error, and to the left with positive phase error. Referring to FIG. 3, focal shift is illustrated in both directions. Curve 312 illustrates the shift for a feature having negative phase error, and curve 313 illustrates the shift for a feature having positive phase error. Note that on a reticle having both +180° features and −180° features, an insufficient quartz etch will result in negative phase error for the +180° features and positive phase error for the −180° features. This effect is the focal shift in opposite directions referred to earlier. As can be seen from FIG. 3, on a reticle having both types of features, the depth of focus 314 across the reticle is greatly reduced compared to the depth of focus 211 of FIG. 2. Note that the depth of focus is reduced even where there is only a single type of phase-shifted feature together with a non phase-shifted feature. For example, assuming the phase-shifted feature has negative phase error (curve 312), it will limit the negative defocus, while the non phase-shifted feature (curve 200a) will limit the positive defocus, as can be seen from FIG. 3. For a more thorough discussion of this effect, see the above referenced patent application Ser. No. 08/012,564.

In light of the above discussion, it can be seen that in addition to maintaining a precise 180° phase-shift for maximum effectiveness, it is also desirable to achieve a phase-shift as close as possible to 180° to avoid focal shift and the consequent reduction in depth of field. As noted earlier, wafer tilt, non planarity, or steep topography may result in a portion of a wafer being displaced from the focal plane. Additionally, as described above, similar type errors may distort the data from the exposure matrix, so that the initial process may be characterized with a slightly displaced focal distance.

Figure 4:
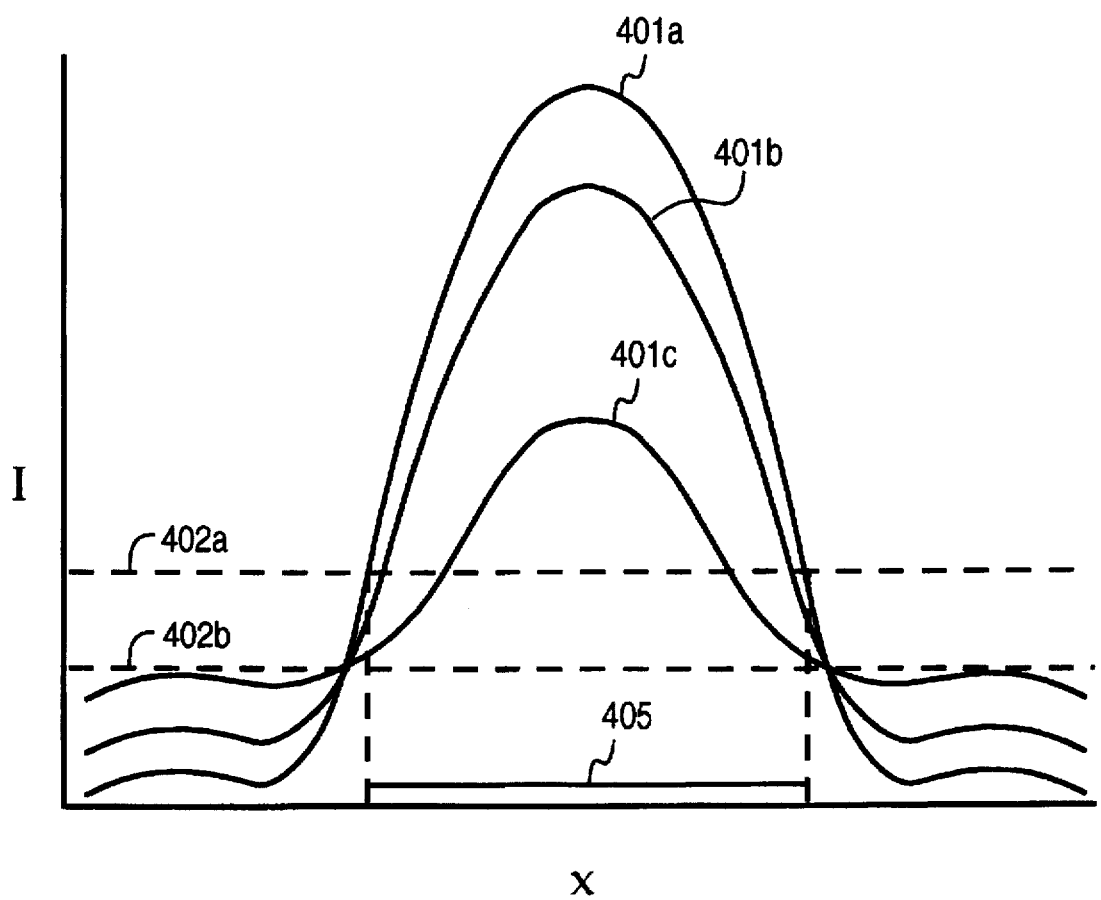
FIG. 4 illustrates an aerial image obtained from a feature in a phase-shifted reticle.

It will be appreciated that the data shown in FIGS. 2 and 3 can also be produced through use of aerial images obtained from an aerial image measurement system (AIMS) such as that developed by Zeiss and IBM. FIG. 4 shows an example of a series of aerial images. To produce the images, the reticle is placed in the system and an exposure is performed at several focal distances. The intensity level at a given focal distance is measured underneath a feature. A two dimensional slice of the aerial image going through the feature is plotted showing intensity as a function of position underneath the feature. Curves 401a–401c illustrate the aerial image from three different focal positions. For example, curve 401a may represent zero defocus, 401b represents an aerial image at some defocus from best focus, and 401c represents an aerial image at a greater defocus than 401b. As shown, the intensity peaks in the center of the feature, and drops off to either side. An intensity level, such as that shown by line 402a, is chosen at which to measure the CD. For example, level 402a may represent an intensity equal to 30% of the intensity incident upon the reticle. The distance between points at which level 402a intersects each of the curves 401a–401c show the CD for the focal position for each curve. For example, the zero defocus curve 401a intersects intensity level 402a at the position shown by the dashed lines. The distance between these points, shown as distance 405, shows the CD for zero defocus. Similarly, the CD for curves 401b and 401c may similarly be measured by measuring the distance between the intersection of these curves with intensity level 402a. As can be seen from FIG. 4, the CD's for these focal positions are less than that for the zero defocus curve 401a. Therefore, plotting the measured CD versus the defocus results in a curve similar to curve 200a of FIG. 2. In general, the curves for both positive and negative defocus are similar, so that curve 401b may represent a positive or negative defocus of a certain amount, and 401c a positive or negative defocus of a greater amount. Since the exposure level of the exposure matrix of FIG. 1 is a function of the time for which the wafer is exposed, the aerial image is not performed for different exposure levels. However, the intensity level at which the CD is measured may be correlated with different exposure levels on a stepper system. By varying the position of the intensity level, several different curves such as 200a, 200b, and 200c may be obtained by producing the aerial image at several focal distances, and noting the CD for each intensity level at each focal distance. For example, intensity level 402b shows the conjugate iso-focal line where each of the curves have the same CD. The intensity level 402b corresponds to the level 200b of FIG. 2. Of course, the aerial image would not give any information regarding stepper error and wafer non planarity as discussed above in conjunction with the exposure matrix. Regardless of the means by which the data of FIGS. 2 and 3 are obtained, a comparison of the focal shift of two non structurally identical phase-shifted features, or comparison of a phase-shifted feature to a non phase-shifted feature can be used to determine phase-shift, as will be described more fully below.

Figure 5:
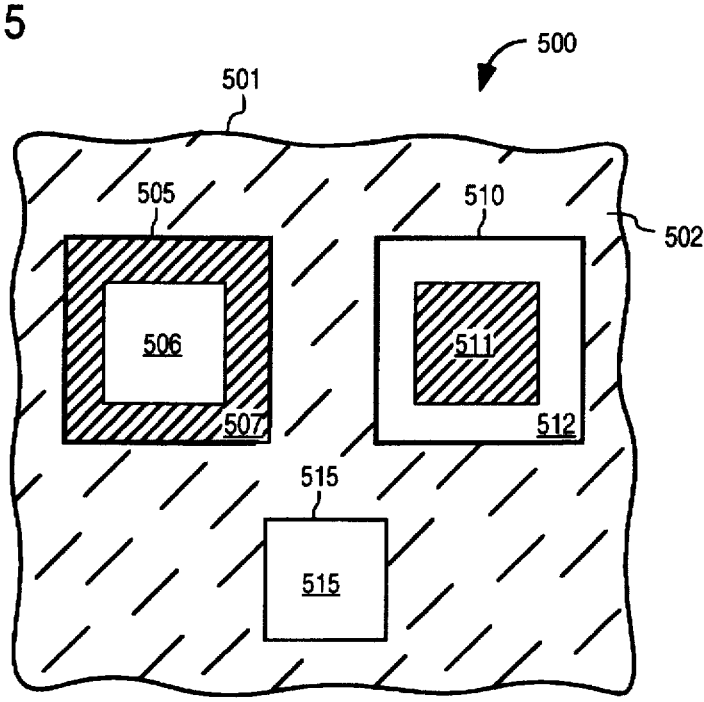
FIG. 5 illustrates an embodiment of the present invention.

FIG. 5 shows an embodiment of the present invention. Metrology pattern 500, comprising features 505, 510, and 515 is disposed on reticle 501. Region 502 surrounding features 505, 510, and 515 comprises an opaque material such as chrome. Features 505 and 510 are phase-shifted features, while feature 515 is a standard binary feature. As shown, feature 505 comprises opening 506 and phase-shifting rim 507. Feature 510 comprises opening 511 and phase-shifting rim 512. All of regions 506, 507, 511, 512, and 515 transmit substantially all radiation incident thereon in a preferred embodiment. Opening 506, and rim 512 may be for example, the 0° phase, while rim 507 and opening 511 are the 180° phase. Thus, patterns 505 and 510 are non structurally identical. Metrology pattern 500 may be used in accordance with the principles herein on a characterization reticle as a tool to determine an absolute reference between measured thickness and phase-shift, so that a target thickness can be determined to be used for the fabrication of production reticles (reticles used in the fabrication of semiconductor devices) fabricated on the same type of reticle blank as the characterization reticle. The characterization reticle comprises several such metrology patterns 500, each with a different shifter thickness, as will be discussed more fully below.

Figure 6:
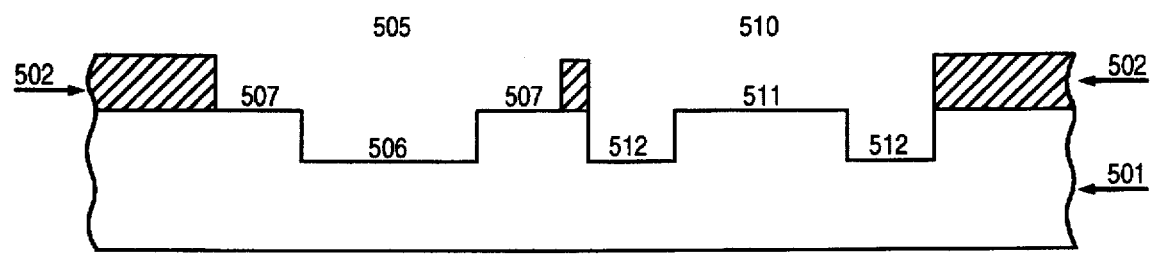
FIG. 6 shows a cross-section elevation view of a portion of the reticle of FIG. 5.

FIG. 6 shows a cross-sectional view through the middle of patterns 505 and 510 of metrology pattern 500. As can be seen, pattern 505 is a +180° structure since phase-shifting rim 507 is 180° above opening 506, and pattern 512 is a −180° pattern. Pattern 515 of course simply comprises an opening in opaque layer 502 having approximately the same dimension as opening 506 or 511.

In the present discussion, various thicknesses, t are discussed. These thicknesses represent, in a currently preferred embodiment, the amount of quartz etched from an opening or its phase-shifter, i.e., the thickness difference causing the phase-shift. For the characterization reticle described above, metrology patterns 500 of several different thicknesses are produced. There may be a single metrology pattern 500 for each of the different thicknesses, or there may be several metrology patterns 500 for each of the thicknesses to provide more data. The fabrication of the characterization reticle thus requires several process steps since a separate masking and etch step must be performed for each different thickness. It should be noted that the etch process used to remove quartz from a shifter or opening is relatively uniform across the reticle and especially uniform for the side by side features in a single metrology pattern 500. Therefore, the regions such as regions 506 and 512 in a single metrology pattern 500 which are exposed during a given etch all have virtually the same amount of quartz removed. The thicknesses can be measured by optical means, or by for example, a stylus measurement. These thickness measurements can typically be made with a relatively high precision. However, although the thickness measurements may be precise, (e.g., a repeatability of less than or equal to 20 Å is achievable) there is no absolute reference for the thickness values obtained, nor is there an absolute reference to relate thickness to phase-shift. As will be seen, the present invention provides a means for relating the measured thickness to the actual phase-shift.

After fabrication of the above described test reticle, an exposure matrix or series of aerial images is performed. In either case, the CD versus defocus data are obtained and plotted as described above for each of the different thicknesses. In the following FIGS. 7–10, the CD versus defocus curves for each of the features in the metrology pattern 500 is shown. For purposes of illustration, the curve produced by feature 505 is composed of asterisks, and is denoted by the reference numeral 705. The curve for feature 510 is shown as a dotted line, and is denoted by the reference numeral 710. Finally, the curve produced by the non phase-shifted feature 515 is shown by a solid line and denoted by the reference numeral 715. FIGS. 7–10 illustrate the CD versus defocus curve for four different thicknesses, $t_1$–$t_4$. This is denoted in FIGS. 7–10 by adding the reference letters a–d, corresponding to thicknesses $t_1$–$t_4$, respectively, to each curve. It will be appreciated that although the data from the metrology pattern 500 of the present invention is illustrated graphically, the CD versus defocus data, from either an exposure matrix or series of aerial images, may be analyzed numerically, without a need to graph the data. Further, it will be appreciated that the results shown in FIGS. 7–10, the summary of the results shown in FIG. 11, and the discussion and examples of thicknesses of phase-shift described in relation thereto, are for purposes of illustration, and do not necessarily represent any specific set of exposure parameters, reticle types, thicknesses, etc.

Figure 7:
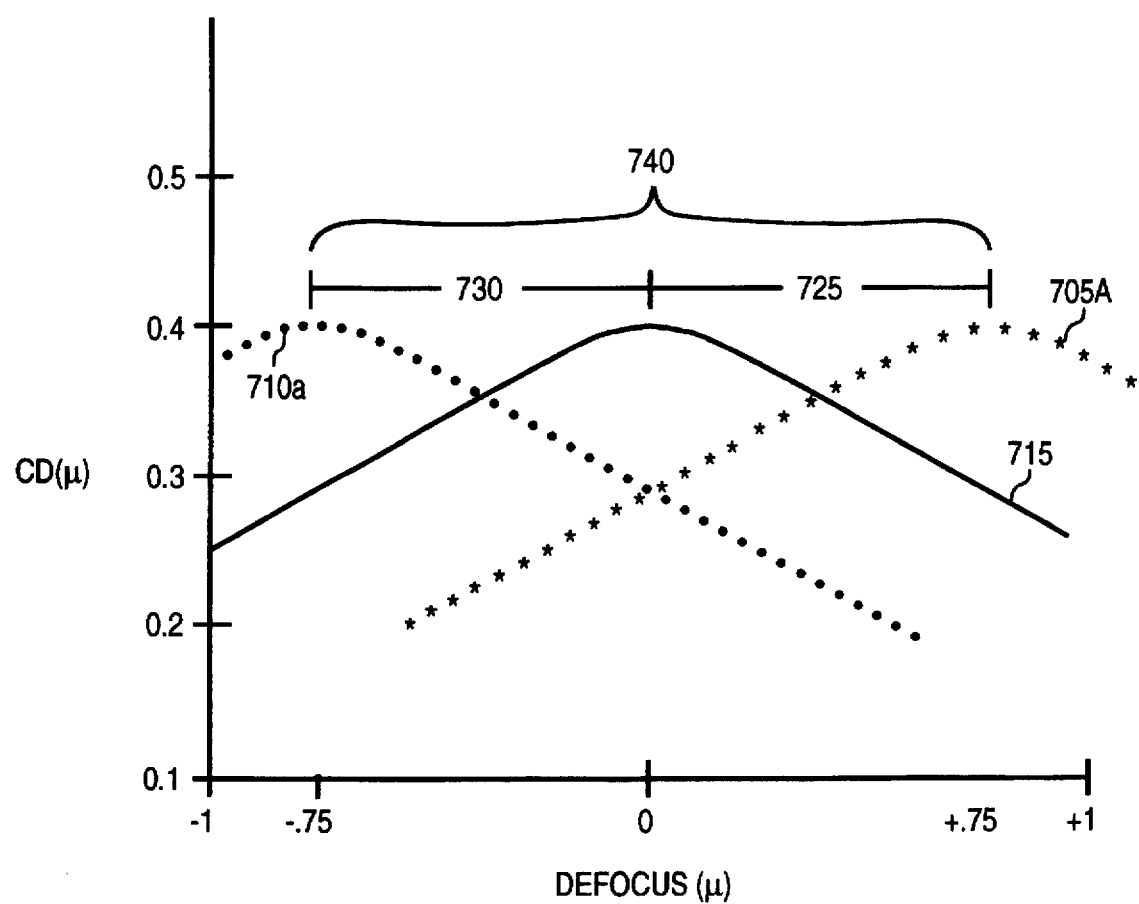
FIG. 7 shows the data obtained from an exposure matrix for a first phase-shifter thickness for two phase-shifted features in the metrology pattern.

FIG. 7 shows the CD versus defocus curves 705a, 710a, and 715 for features 505, 510, and 515, respectively, for a first thickness $t_1$. The thickness $t_1$ is less than that necessary to achieve a phase-shift having a magnitude of 180°. Since feature 505 is a +180° structure, a thickness less than that necessary for a 180° phase-shift means that rim 507 is less than 180° above opening 506, resulting in a negative phase error. Therefore, curve 705a is shifted right a distance 725 compared with a phase-shift of precisely 180°, or compared with a non phase-shifted feature. Curve 710a shows the data obtained for a feature 510 having a shifter thickness of $t_1$. Since feature 510 is a −180° feature, the thickness $t_1$ in feature 510 results in a phase-shift less negative than the nominal −180. Therefore, in the structure 510 a positive phase-shift results for thickness $t_1$ so that the curve 710a shifts left a distance 730 as shown. Finally, curve 715 shows the data obtained for the non phase-shifted feature 515. Curve 715 of course has no focal shift.

Figure 8:
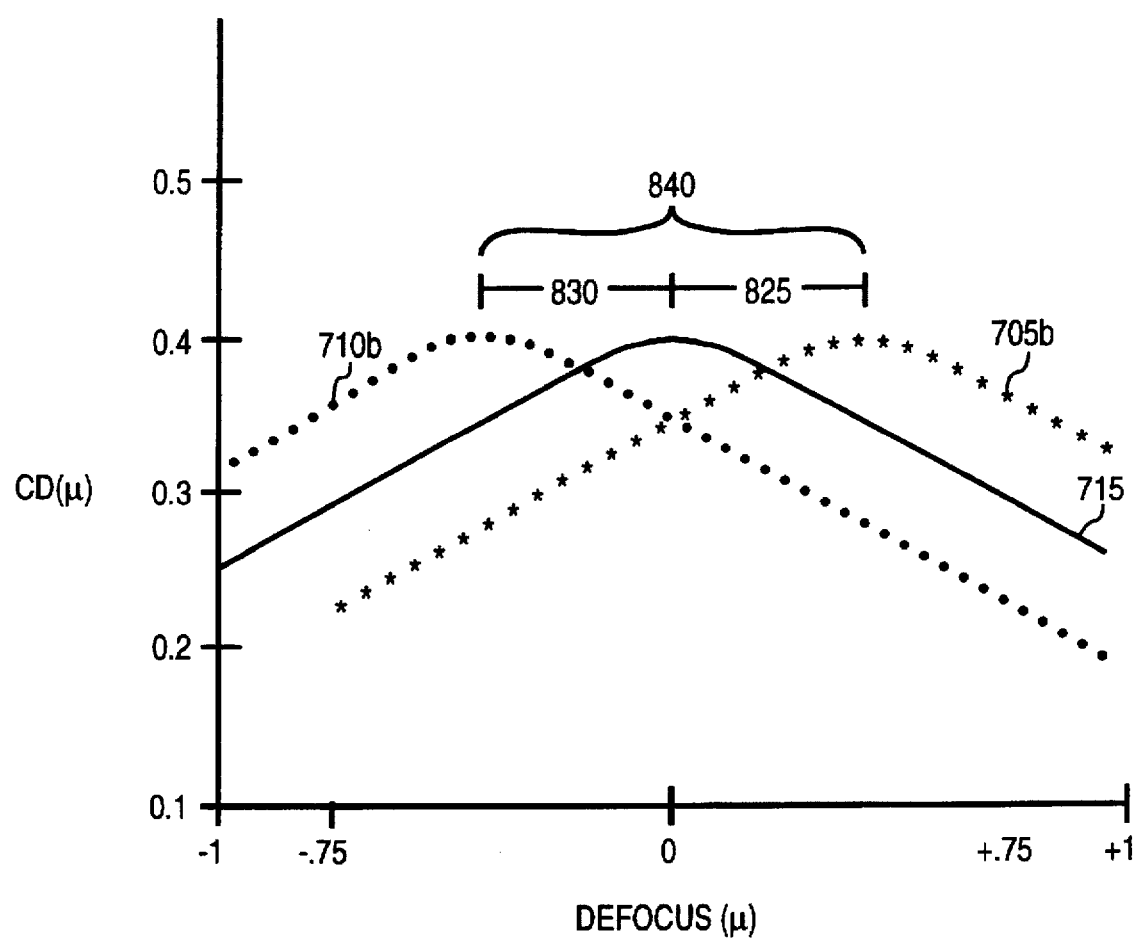
FIG. 8 shows the data obtained from an exposure matrix for a second phase-shifter thickness for two phase-shifted features in the metrology pattern.
Figure 9:
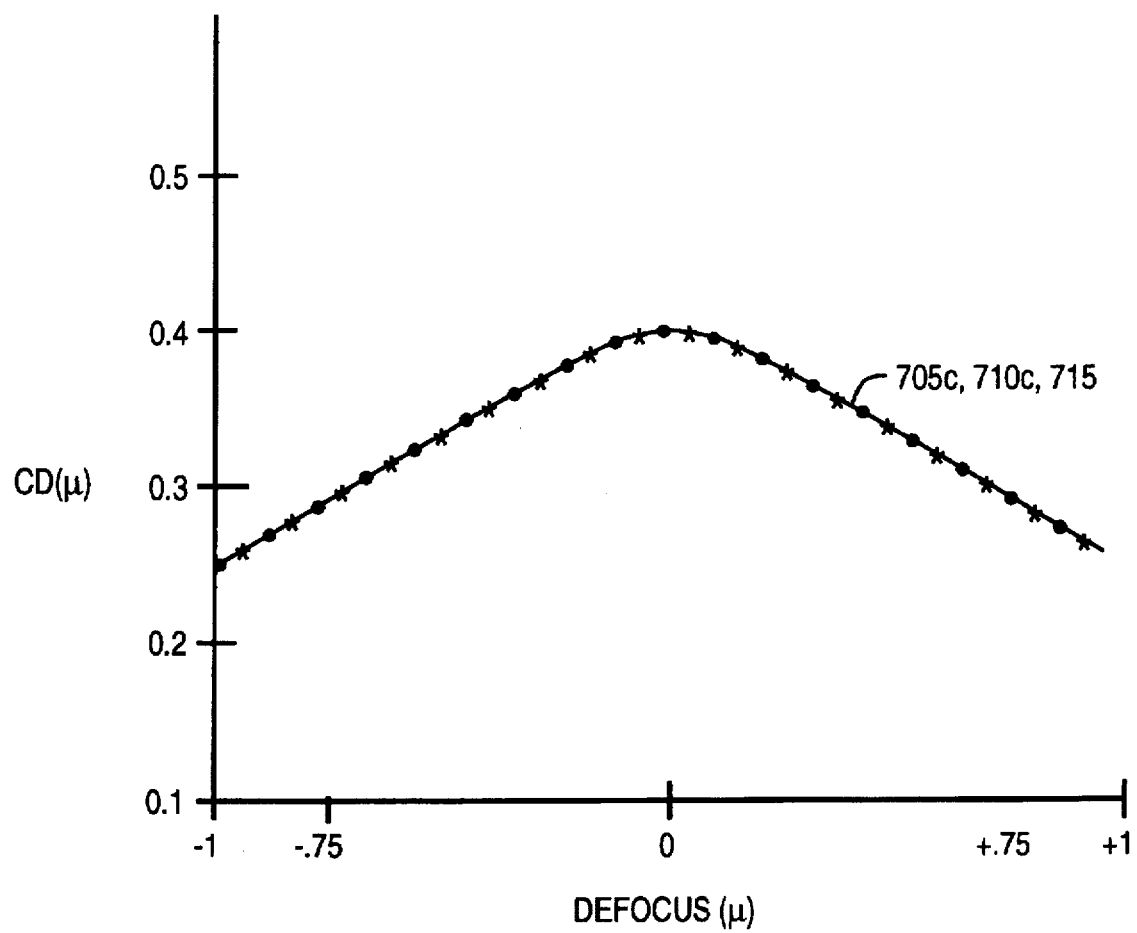
FIG. 9 shows the data obtained from an exposure matrix for a third phase-shifter thickness for two phase-shifted features in the metrology pattern.
Figure 10:
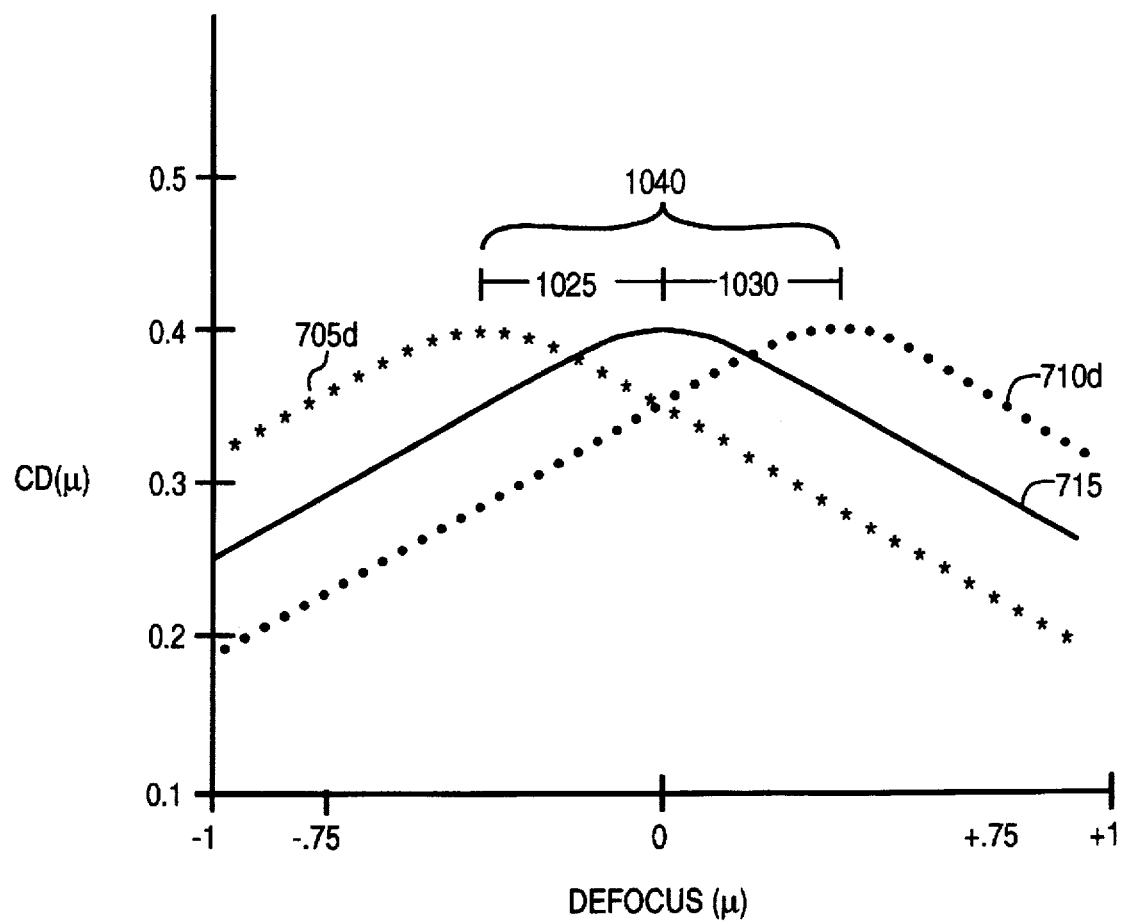
FIG. 10 shows the data obtained from an exposure matrix for a fourth phase-shifter thickness for two phase-shifted features in the metrology pattern.

FIG. 8 shows the results obtained for the features 505 and 510 for a thickness $t_2$ which is greater than $t_1$, but is still less than that necessary to achieve a phase-shift having a magnitude of 180°. Therefore, as shown, the curve 705b for feature 505 still shifts to the right a distance 825. As can be seen, distance 825 is less than the distance 725 for curve 705a of FIG. 7 for $t_1$. Similarly, curve 710b for feature 510 shifts to the left a distance 830, which is less than the distance 730 for curve 710a for the feature 510 having a thickness $t_1$. Again, the curve 715 for the feature 515 shows no focal shift. FIG. 9 shows the CD versus defocus curves for features 505 and 510 for a thickness $t_3$ which is precisely that needed to achieve 180° focal shift. Note that curve 705c for feature 505, curve 710c for feature 510, and curve 715 for feature 515 in the metrology pattern 500 having thickness $t_3$ all overlap when the phase-shift is precisely 180°. Finally, referring to FIG. 10, the CD versus defocus curves for a fourth thickness $t_4$ are shown. The thickness $t_4$ is greater than that necessary for a phase-shift of magnitude 180°, resulting in positive phase-shift for the +180° feature 505 and negative phase error for the −180° feature 510. Therefore, as can be seen, the CD versus defocus curve 705d for feature 505 has shifted left a distance 1025, while the curve 710d for the feature 510 has shifted right a distance 1030.

Thus, as can be seen from the above discussion, when there is a perfect phase-shift of 180°, the CD versus defocus curves for both patterns 505 and 510 overlap one another. Additionally, these patterns overlap the curve for the non phase-shifted pattern 515. It will be appreciated that due to the effects of phase-shifting, the measured CD in the patterned resist layer for the features 505, 510, and 515 may be slightly different from each other. Therefore, the curves may not be as symmetrical as shown and may not completely overlap one another at zero defocus. However, at any non iso-focal exposure, a maxima or minima can still be determined. Further, the maxima or minima of the curve for any features having a precise phase-shift of 180° (or no phase-shift) will occur at the same location on the x axis. Therefore, focal shift can be determined by a comparison of the location of the maxima or minima of one curve to that of another, as described generally herein. Since the focal shift can be determined from the maxima or minima, the dimensions of features 505, 510, and 515 do not necessarily need to be the same as one another. In addition, it will be appreciated that the features in a first set of metrology patterns do not necessarily need to have the same dimensions as the features in a second set of metrology patterns, since the location of the maxima or the minima for each shifter thickness may be determined by noting the maxima or minima in the CD versus defocus curve as described above. In a currently preferred embodiment, the reticle dimension of feature 515, opening 506, and opening 511 are approximately equal to one another in a given metrology pattern as well as from one metrology pattern to the next, so that the curves have the same general shape as one another.

It will be appreciated that a reticle manufacturer does not necessarily need to know the value of the thickness at which the above-described overlap occurs. Rather, the manufacturer may use the data obtained to characterize the phase-shifter etch process, so that the etch time and other parameters which produced the patterns 505 and 510 having the overlap on the test reticle, are used in the fabrication of phase-shifted production reticles.

As described above, for each thickness, the amount of focal shift for each type of feature can be measured. For the case of $t_3$, the focal shift was zero, showing that at this thickness there is zero phase error, i.e., a phase-shift of precisely 180°. The phase error of the thicknesses which produced the other curves can be determined by comparing the other thicknesses to the 180° thickness as follows:

$$\text{phase error} = (\pm)\frac{t - t_{180}}{t_{180}} * 180° \qquad 3)$$

Where $t_{180}$ equals the thickness when the curves overlap (i.e., $t_3$ in the above example shown in FIG. 9), and t equals the thickness for which it is desired to determine the phase error. For the form of equation 3, the + is used for +180 features, and the − is used for −180 features. For example, assume that in the example of FIGS. 7–10, $t_1$ is 3500 Å, $t_2$ is 3600 Å, $t_3$ is 3700 Å, and $t_4$ is 3800 Å. For the +180° feature 505, the phase error for the thicknesses $t_1$, $t_2$, $t_3$, and $t_4$ are determined from equation 3 as follows:

4) ($t_1$) phase error=+(3500−3700)/3700 * 180°=−9.7°
5) ($t_2$) phase error=+(3600−3700)/3700 * 180°=−4.9°
6) ($t_3$) phase error=+(3700−3700)/3700 * 180°=0°
7) ($t_5$) phase error=+(3800−3700)/3700 * 180°=+4.9°

For the −180° feature, the phase error for thicknesses $t_1$, $t_2$, $t_3$, and $t_4$ has the same magnitude, but opposite sign of the phase error given above for the +180° feature. The above procedure thus results in an absolute reference between measured thickness and zero phase error, so that a measured thickness versus phase error correlation may be established as shown above. A reticle manufacturer may use this correlation to determine the phase-shift of all production reticles produced, by simply measuring the thickness of the phase shifter. Note that this determination does not require any absolute reference to the actual thickness, since all measurements may be performed on a single system. Note that while the determined phase error is dependent on the thickness measurements obtained, as shown by equations 4–7, any error in the calculated phase-error due to inaccuracy of the thickness measurement is minimal.

Figure 11:
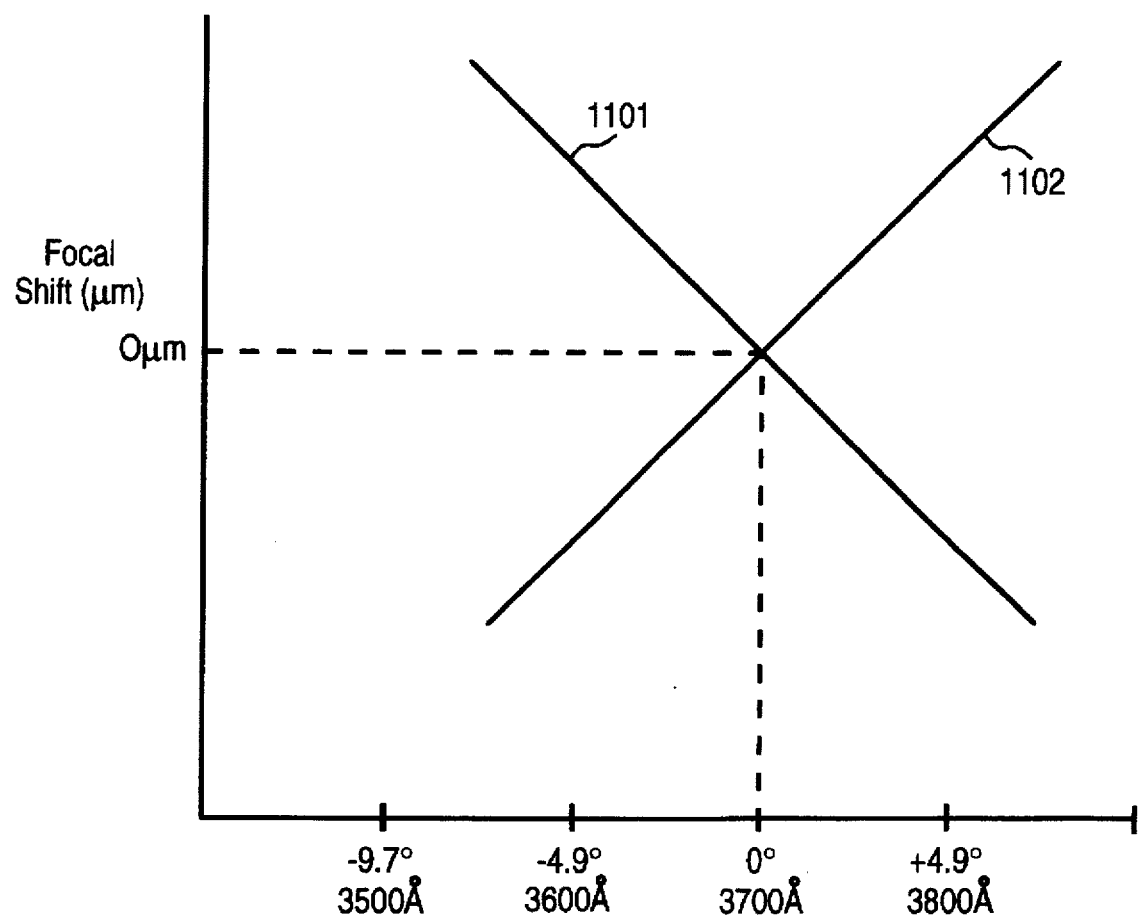
FIG. 11 shows focal shift plotted as a function of phase error.

FIG. 11 shows a summary of some of the results obtained from FIGS. 7–10. In FIG. 11, focal shift is plotted versus thickness and phase error (approximately as determined from the example above) for the +180° feature. The focal shift versus phase error thickness relationship is shown as curve 1101. As shown, at the lower thicknesses (negative phase error) the focal shift is in a positive direction, and at the higher thicknesses (positive phase error) the focal shift is in the negative direction. At the thickness of 3700 Å, there is zero focal shift. Note that curve 1102 for the −180° feature 510 is similar to curve 1101, but has a slope of opposite sign. The data of FIG. 11 may be used in several ways. For example, the data may be used to determine the precise thickness for zero phase error. In the example above, $t_3$ was the precise thickness for zero phase error. However, in practice none of the several thicknesses used may produce an exact phase-shift of zero. In such a case, focal shift may be plotted as a function of measured thickness. Then, the precise 180° thickness can be determined by noting the x axis coordinate where the zero focal shift intersects curve 1101, as illustrated by the dashed lines in FIG. 11, or by noting the x axis coordinate where the curves 1101 and 1102 intersect. The phase error at each thickness can then be calculated per equation 3, above.

The data in FIG. 11 may also be used to determine the phase error from measured focal shift. This may be desirable in cases where the manufacturer of the reticle produces the reticle for sale to another manufacturer. For example, a reticle manufacturer may provide reticles to a semiconductor chip manufacturer. In this case, the chip manufacturer may desire an independent means for determining phase error. In general, the semiconductor manufacturer's and the reticle manufacturer's thickness measurement systems would not be calibrated to the same standard, so that the semiconductor manufacturer could not use the measured thickness to determine phase error, since the offset between different thickness measurement systems would be too great to provide an accurate result. Therefore, if desired, the reticle manufacturer may provide on each reticle, the metrology pattern 500. In this way, the semiconductor manufacturer may perform an exposure matrix, and by comparing the focal shift with the data of FIG. 11 determine the phase error. Depending upon the specific reticle, provision of the metrology pattern on all reticles may or may not involve additional processing. Thus, provision of metrology pattern 500 on production reticles allows for the reticle purchaser to perform an incoming quality control to determine the phase-shift on each purchased reticle. When metrology pattern 500 is used for a precise determination of the phase-shift on the production reticle, the production reticle may have only one such metrology pattern 500, or alternatively may have several to provide more data, for use as a uniformity check, for example. When metrology pattern 500 is used on a production reticle, it is placed in an inactive area of the die, or in the scribelines, etc.

Note that the information obtained for the patterns 505, 510, and 515 is duplicative to some extent. As can be seen from the above discussion, a single phase-shifted feature will produce a CD versus defocus curve, and that curve will be shifted if there is phase error. Without some reference, there is no way of knowing the amount or direction of the focal shift. However, in addition to a first phase-shifted feature, either a non structurally identical phase-shifted feature or a non phase-shifted feature will provide that reference, and both are not necessary. This can be seen from FIGS. 7–10 wherein the curve for either type of phase-shifted feature was shown to overlap with the non phase-shifted feature at zero phase error, thereby providing a reference thickness value. Therefore, in a further embodiment of the present invention, a single such feature 505 or 510 and a non phase-shifted feature 515 is used for the metrology pattern. Zero phase error is determined by noting the thickness at which the phase-shifted feature curve overlaps the non phase-shifted feature curve, and the amount of focal shift of the other curves can be determined by reference to the overlap position. In other words, this method generates curve 715, and additionally either curves 705a–705d, or curves 710a–710d, depending upon which phase-shifted feature is used.

Similarly, as discussed in relation to FIGS. 7–10, the curves for the two non structurally identical phase-shifted features having the same thicknesses are approximately equidistant from zero defocus when there is phase error and overlap at zero phase error. Therefore, in another embodiment of the present invention, the metrology pattern of the present invention comprises only the phase-shifted features 505 and 510. As before, the metrology pattern having only features 505 and 510 can be placed on a characterization reticle with several such pairs of features, each pair etched to a different thickness. This metrology pattern in essence produces the curves 705a–705d and 710a–710d. Zero defocus can be determined by noting the position of the curves at a thickness when the curves overlap (as in FIG. 9), or by noting the midpoint of the separation, for example, the midpoint of the distance 740 of FIG. 7. This data can be used generally as described above by plotting the total focal shift (e.g., distances 740, 840, and 1040) versus thickness. For the purposes of plotting the focal shift between the two curves versus phase error and shifter thickness, the direction of shift in FIGS. 7 and 8 (i.e., distances 740 and 840) may be defined as positive, while the direction of shift in FIG. 10 (i.e., distance 1040) may be defined as negative. With this definition, the plot of focal shift versus phase error and thickness is similar to that shown in FIG. 11, except the slope is ½ as great. It will be appreciated from the above discussion, that one advantage of having an embodiment with both a +180 and a −180 feature, is that since both exhibit phase-shift, the sensitivity of the method is doubled.

It will be appreciated that in any embodiment of the present invention having the non phase-shifted feature, the non phase-shifted feature does not have to be placed in each of the metrology patterns 500. For example, if a characterization reticle is provided with several phase-shifted features of different thicknesses, as described herein, there need only be one non phase-shifted feature in each exposure field.

As described earlier, the present invention can be practiced on any type of phase-shifted mask. Of course, in the attenuated phase-shifted mask, the most practical embodiment is a metrology pattern having a phase-shifted feature and a non phase-shifted feature. Further, for this type mask, special processing is necessary to provide the non phase-shifted feature, since an opaque layer needs to be provided surrounding it.

Referring again to FIG. 1, note that the phase-shift depends on wavelength. Therefore, the aerial image or exposure matrix generating the data shown in FIGS. 7–10 must be performed at the desired exposing wavelength. If a reticle blank is to be used at several different wavelengths, a characterization reticle for each exposing wavelength, with the thickness centered about the approximate 180° thickness may be produced. Alternatively, a characterization reticle may be produced with a sufficient range of thicknesses, so that the data described above may be obtained for several different exposure wavelengths to provide CD versus defocus curves with both positive and negative focal shift for all wavelengths of interest.

The data from the test reticle may be used to provide an accurate measure of n, by rearranging equation 1 as follows:

$$n = x\lambda/2t + 1 \qquad 8)$$

Where t is the thickness at which there is a phase-shift of precisely 180°. Although the thickness measurement has some inaccuracy, the accuracy with which thickness can be measured is typically greater than that with which n can be achieved so that this determination of n is more accurate than that achieved from systems which measure n directly. The integer x is typically 1 by design.

As described earlier, the individual two or three features in the metrology pattern of the present invention are physically disposed close to one another. The metrology pattern of the present invention may thus be used to characterize the lens of the stepping system, by providing numerous such patterns in a single field, all having the same thickness shifter. In this way, the focal shift, if any due to phase error will be known. Therefore, any deviation from this known shift, in any of the patterns would be due to the exposure system, thereby providing a useful characterization of the performance of the exposure system.

Thus, a method and apparatus for providing an absolute reference for phase-shift and shifter thicknesses and for precision determination of phase-shift, has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method of determining phase-shift in a phase-shifted reticle comprising the steps of:
   providing on said reticle a first feature, said first feature being a phase-shifted feature;
   providing on said reticle a second feature;
   measuring a first dimension of a first image of said first feature and a second dimension of a second image of said second feature; and
   determining said phase-shift based upon a comparison of said first dimension and said second dimension.

2. The method as described in claim 1 wherein a plurality of said first features are provided on said reticle, wherein the magnitude of said phase-shift of at least one of said first features is different from the magnitude of said phase-shift of another of said first features, and wherein said method further comprises the step of measuring said first dimension of said first image for each of said plurality of said first features.

3. The method as described in claim 2 wherein said first dimension of said first feature is measured at a plurality focal distances for each of said plurality of said first features, to form a first dimension versus focal distance relationship for each of said first features, and wherein said second dimension of said second feature is measured at said plurality of focal distances to form a second dimension versus focal difference relationship for said second feature.

4. The method as described in claim 3 wherein a focal shift is determined for each of said plurality of first features by comparing each of said first dimension versus focal distance relationships to said second dimension versus focal distance relationship.

5. The method of claim 4 wherein said method further comprises the step of determining a focal shift versus phase error relationship.

6. The method as described in claim 5 wherein said phase-shift of said plurality of first features is created by a thickness of a material, and wherein said step of determining said focal shift versus phase error relationship is determined by:
   correlating said focal shift of each of said first features with said thickness of each of said first features;
   determining a zero phase error thickness value; and,
   determining phase error for each of said plurality of first features by comparing said thickness of each of said first features to said zero phase error thickness value to produce said focal shift versus phase error relationship.

7. The method as described in claim 6 further comprising the steps of:
   producing a correlation between said thickness and said phase error;
   providing a second reticle having a second reticle phase-shifted feature;
   measuring a second reticle thickness of said second reticle phase-shifted feature; and,
   determining a second reticle phase error by comparing said second reticle thickness to said correlation between said thickness and said phase error.

8. The method as described in claim 7 wherein each of said plurality of first features comprises a first reticle dimension corresponding to said first dimension of said first image, and said second feature comprises a second reticle dimension corresponding to said second dimension of said second image, wherein said first reticle dimension and said second reticle dimension are approximately equal.

9. The method as described in claim 6 further comprising the steps of:
   providing a second reticle having said first feature and said second feature;
   measuring said first dimension of said first feature and said second dimension of said second feature on said second reticle at a second plurality of focal distances to form a second reticle first dimension versus focal distance relationship for said first feature on said second reticle and a second reticle second dimension versus focal distance relationship for said second feature on said second reticle;
   determining a focal shift of said first feature by comparing said second reticle first dimension versus focal distance relationship for said first feature on said second reticle to said second reticle second dimension versus focal distance relationship for said second feature on said second reticle; and,
   determining a phase error of said second reticle by comparison to said focal shift versus phase error relationship.

10. The method as described in claim 6 wherein each of said plurality of first features comprises a first reticle dimension corresponding to said first dimension of said first image, and said second feature comprises a second reticle dimension corresponding to said second dimension of said second image, wherein said first reticle dimension and said second reticle dimension are approximately equal.

11. The method as described in claim 5 further comprising the steps of:
   providing a second reticle having said first feature and said second feature;
   measuring said first dimension of said first feature and said second dimension of said second feature on said second reticle at a second plurality of focal distances to form a second reticle first dimension versus focal distance relationship for said first feature on said second reticle and a second reticle second dimension versus focal distance relationship for said second feature on said second reticle;
   determining a focal shift of said first feature by comparing said second reticle first dimension versus focal distance relationship to said second reticle second dimension versus focal distance relationship; and,
   determining a phase error of said second reticle by comparison to said focal shift versus phase error relationship.

12. The method as described in claim 5 wherein each of said plurality of first features comprises a first reticle dimension corresponding to said first dimension of said first image, and said second feature comprises a second reticle dimension corresponding to said second dimension of said second image, wherein said first reticle dimension and said second reticle dimension are approximately equal.

13. The method as described in claim 2 wherein each of said plurality of first features comprises a first reticle dimension corresponding to said first dimension of said first image, and said second feature comprises a second reticle dimension corresponding to said second dimension of said second image, wherein said first reticle dimension and said second reticle dimension are approximately equal.

14. The method as described in claim 1 wherein said first dimension of said first feature is measured at a plurality of focal distances to form a first dimension versus focal distance relationship for said first feature, and wherein said second dimension of said second feature is measured at said plurality of focal distances to form a second dimension versus focal distance relationship for said second feature.

15. The method as described in claim 1 wherein said first dimension of said first feature and said second dimension of said second feature are measured at a plurality of focal distances to form a first relationship of dimension versus focal distance for said first feature, and a second relationship of dimension versus focal distance for said second feature, wherein said method comprises determining a focal shift by comparing said first relationship and said second relationship, and wherein said step of determining said phase-shift comprises comparing said focal shift to a focal shift versus phase error relationship.

16. The method as described in claim 1 wherein said first feature comprises a first reticle dimension corresponding to said first dimension of said first image, and said second feature comprises a second reticle dimension corresponding to said second dimension of said second image, wherein said first reticle dimension and said second reticle dimension are approximately equal.

17. A method of determining phase-shift in a phase-shifted reticle comprising the steps of:
providing on said reticle a first feature, said first feature being a phase-shifted feature;
providing on said reticle a second feature;
providing on said reticle a third feature, said third feature being a phase-shifted feature, wherein said phase-shift of said first feature is in an opposite direction of said phase-shift of said second feature;
measuring a first dimension of a first image of said first feature, a second dimension of a second image of said second feature, and third dimension of a third image of said third feature; and,
determining said phase-shift based upon a comparison of said third dimension to one or both of said first dimension and said second dimension.

18. The method as described in claim 17 wherein a plurality of sets of said first features and said third features are provided on said reticle, wherein the magnitude of said phase-shift of said first feature and said third feature in each of said plurality of sets is approximately equal, and wherein the magnitude of said phase-shift of at least one of said sets is different from the magnitude of said phase-shift of another of said sets, and wherein said method further comprises the step of measuring said first dimension of said first image and said third dimension of said third image for each of said plurality of sets.

19. The method as described in claim 18 wherein said first dimension of said first feature is measured at a plurality of focal distances for each of said plurality of first features to form a first dimension versus focal distance relationship for each of said first features, wherein said second dimension of said feature is measured at said plurality of focal distances to form a second dimension versus focal distance relationship for said second feature, and wherein said third dimension of said third feature is measured at said plurality of focal distances for each of said plurality of said third features to form a third dimension versus focal distance relationship for each of said third features.

20. The method as described in claim 19 wherein a focal shift is determined for each of said plurality of first features by comparing each of said first dimension versus focal distance relationships to one or both of said second dimension versus focal distance and said third dimension versus focal distance relationships, and wherein a focal shift is determined for each of said plurality of third features by comparing each of said third dimension versus focal shift relationships to one or both of said first dimension versus focal distance and said second dimension versus focal distance relationships.

21. The method as described in claim 20 wherein said method further comprises determining a focal shift versus phase error relationship.

22. The method as described in claim 21 wherein said phase-shift of said plurality of first features is created by a thickness of a material, and wherein said step of determining said focal shift versus phase error relationship is determined by:
correlating said focal shift of each of said first features and said third feature with said thickness of each of said first features and said third features, respectively;
determining a zero phase error thickness value; and,
determining phase error for each of said plurality of first features and said third features by comparing said thickness of each of said first features and said third features to said zero phase error thickness value to produce said focal shift versus phase error relationship.

23. The method as described in claim 22 further comprising the steps of:
producing a correlation between said thickness and said phase error;
providing a second reticle having a second reticle phase-shifted feature;
measuring a second reticle thickness of said second reticle phase-shifted feature; and,
determining a second reticle phase error by comparing said second reticle thickness to said correlation between said thickness and said phase error.

24. The method as described in claim 22 wherein each of said plurality of first features comprises a first reticle dimension corresponding to said first dimension of said first image, said second feature comprises a second reticle dimension corresponding to said second dimension of said second image, and each of said plurality of third features comprises a third reticle dimension corresponding to said third dimension of said third image, wherein said first reticle dimension, said second reticle dimension, and said third reticle dimension are approximately equal.

25. The method as described in claim 21 wherein each of said plurality of first features comprises a first reticle dimension corresponding to said first dimension of said first image, said second feature comprises a second reticle dimension corresponding to said second dimension of said second image, and each of said plurality of third features comprises a third reticle dimension corresponding to said third dimension of said third image, wherein said first reticle dimension, said second reticle dimension, and said third reticle dimension are approximately equal.

26. The method as described in claim 20 wherein each of said plurality of first features comprises a first reticle dimension corresponding to said first dimension of said first image, said second feature comprises a second reticle dimension corresponding to said second dimension of said second image, and each of said plurality of third features comprises a third reticle dimension corresponding to said third dimension of said third image, wherein said first reticle dimension, said second reticle dimension, and said third reticle dimension are approximately equal.

27. The method as described in claim 18 wherein each of said plurality of first features comprises a first reticle dimension corresponding to said first dimension of said first image, said second feature comprises a second reticle dimension corresponding to said second dimension of said second image, and each of said plurality of third features comprises a third reticle dimension corresponding to said third dimension of said third image, wherein said first reticle dimension, said second reticle dimension, and said third reticle dimension are approximately equal.

28. The method as described in claim 17 wherein said first dimension of said first feature is measured at a plurality of focal distances to form a first dimension versus focal distance relationship for said first feature, wherein said second dimension of said second feature is measured at said plurality of focal distances to form a second dimension versus focal distance relationship for said second feature, and wherein said third dimension of said third feature is measured at said plurality of focal distances to form a third dimension versus focal distance relationship for said third feature.

29. The method as described in claim 17 wherein said first feature comprises a first reticle dimension corresponding to said first dimension of said first image, said second feature comprises a second reticle dimension corresponding to said second dimension of said second image, and said third feature comprises a third reticle dimension corresponding to said third dimension of said third image, wherein said first reticle dimension, said second reticle dimension, and said third reticle dimension are approximately equal.

30. A method of determining phase error in a phase-shifted reticle comprising the steps of:
providing on said reticle a first feature, said first feature being a phase-shifted feature;
providing on said reticle a second feature, said second feature being a phase-shifted feature, wherein said phase-shift of said first feature is in an opposite direction of said phase-shift of said second feature;
measuring a first dimension of a first image of said first feature and a second dimension of a second image of said second feature; and
determining said phase-shift based upon a comparison of said first dimension and said second dimension.

31. The method as described in claim 30 wherein a plurality of sets of said first features and said second features are provided on said reticle, wherein the magnitude of said phase-shift of said first feature and said second feature in each of said plurality of sets is approximately equal, and wherein the magnitude of said phase-shift of at least one of said sets is different from the magnitude of said phase-shift of another of said sets, and wherein said method further comprises the step of measuring said first dimension of said first image and said second dimension of said second image for each of said plurality of sets.

32. The method as described in claim 31 wherein said first dimension of said first feature is measured at a plurality of focal distances for each of said plurality of first features to form a first dimension versus focal distance relationship for each of said first features, and wherein said second dimension of said second feature is measured at said plurality of focal distances for each of said plurality of said second features to form a second dimension versus focal distance relationship for each of said second features.

33. The method as described in claim 32 wherein a focal shift is determined for each of said first dimension versus focal distance relationships by reference to said second dimension versus focal distance relationship.

34. The method as described in claim 33 wherein said method further comprises determining a focal shift versus phase error relationship.

35. The method as described in claim 34 wherein said phase-shift of said plurality of first features is created by a thickness of a material, and wherein said step of determining said focal shift versus phase error relationship is determined by:
correlating said focal shift of each of said first features with said thickness of each of said first features;
determining a zero phase error thickness value; and,
determining phase error for each of said plurality of first features by comparing said thickness of each of said first features to said zero phase error thickness value to produce said focal shift versus phase error relationship.

36. The method as described in claim 35 further comprising the steps of:
producing a correlation between said thickness and said phase error;
providing a second reticle having a second reticle phase-shifted feature;
measuring a second reticle thickness of said second reticle phase-shifted feature; and,
determining a second reticle phase error by comparing said second reticle thickness to said correlation between said thickness and said phase error.

37. The method as described in claim 34 further comprising the steps of:
providing a second reticle having said first feature and said second feature;
measuring said first dimension of said first feature and said second dimension of said second feature on said second reticle at plurality of focal distances to form a second reticle first dimension versus focal distance relationship for said first feature on said second reticle and a second reticle second dimension versus focal distance relationship for said second feature on said second reticle;
determining a focal shift of said first feature by comparing said second reticle first dimension versus focal distance relationship to said second reticle second dimension versus focal distance relationship; and,
determining a phase error of said second reticle by comparison to said focal shift versus phase error relationship.

38. The method as described in claim 34 wherein each of said plurality of first features comprises a first reticle dimension corresponding to said first dimension of said first image, and each of said plurality of second features comprises a second reticle dimension corresponding to said second dimension of said second image, wherein said first reticle dimension and said second reticle dimension are approximately equal.

39. The method as described in claim 33 wherein each of said plurality of first features comprises a first reticle dimension corresponding to said first dimension of said first image, and each of said plurality of second features comprises a second reticle dimension corresponding to said second dimension of said second image, wherein said first reticle dimension and said second reticle dimension are approximately equal.

40. The method as described in claim 31 wherein each of said plurality of first features comprises a first reticle dimension corresponding to said first dimension of said first image, and each of said plurality of second features comprises a second reticle dimension corresponding to said second dimension of said second image, wherein said first reticle dimension and said second reticle dimension are approximately equal.

41. The method as described in claim 30 wherein said first dimension of said first feature is measured at a plurality of focal distances to form a first dimension versus focal distance relationship for said first feature, and wherein said second dimension of said second feature is measured at said plurality of focal distances to form a second dimension versus focal distance relationship for said second feature.

42. The method as described in claim 30 wherein said first feature comprises a first reticle dimension corresponding to said first dimension of said first image, and said second feature comprises a second reticle dimension corresponding to said second dimension of said second image, wherein said first reticle dimension and said second reticle dimension are approximately equal.

43. A phase-shifted reticle comprising a metrology pattern, said metrology pattern comprising:
   a first feature, said first feature being a phase-shifted feature; and,
   a second feature, said second feature being a non phase-shifted feature.

44. The reticle as described in claim 43 wherein said first feature and said second feature have an approximately equal dimension.

45. The reticle as described in claim 44 further comprising a third feature, said third feature being a phase-shifted feature, wherein said phase-shift of said third feature is in an opposite direction of said phase-shift of said first feature.

46. The reticle as described in claim 43 further comprising a third feature, said third feature being a phase-shifted feature, wherein said phase-shift of said third feature is in an opposite direction of said phase-shift of said first feature.

47. A phase-shifted reticle comprising a metrology feature, said metrology feature comprising:
   a first feature, said first feature, being a phase-shifted feature; and,
   a second feature, said second feature being a phase-shifted feature wherein said phase-shift of said first feature is in an opposite direction of said phase-shift of said second feature.

48. The reticle as described in claim 47 wherein said first feature and said second feature have an approximately equal dimension.

49. A phase-shifted reticle comprising:
   a plurality of first features, wherein said plurality of first features are phase-shifted features having a first feature phase-shift, and wherein the magnitude of said first feature phase-shift of one of said plurality of first features is different from the magnitude of said first feature phase-shift for another of said plurality of first features; and,
   a second feature, said second feature being a non phase-shifted feature.

50. The reticle as described in claim 49 further comprising:
   a plurality of third features, wherein said plurality of third features are phase-shifted features having a second feature phase-shift, and wherein said first feature phase-shift is in an opposite direction of said third feature phase-shift, and wherein the magnitude of said third feature phase-shift for one of said plurality of third features is approximately equal to that of said one of said plurality of said first features, and wherein the magnitude of said third feature phase-shift for another of said plurality of said second features is approximately equal to that of said another of said plurality of said first features.

51. A phase-shifted reticle comprising:
   a plurality of first features, wherein said plurality of first features are phase-shifted features having a first feature phase-shift, and wherein the magnitude of said first feature phase-shift of one of said plurality of first features is different from the magnitude of said first feature phase-shift for another of said plurality of first features; and,
   a plurality of second features, wherein said plurality of second features are phase-shifted features having a second feature phase-shift, and wherein said first feature phase-shift is in an opposite direction of said second feature phase-shift and wherein the magnitude of said second feature phase-shift for one of said plurality of second features is approximately equal to that of said one of said plurality of said first features and wherein the magnitude of said second feature phase-shift for another of said plurality of said second features is approximately equal to that of said another of said plurality of said first features.

* * * * *